(12) United States Patent
Shu

(10) Patent No.: US 6,682,983 B2
(45) Date of Patent: Jan. 27, 2004

(54) METHOD OF FORMING A BOTTOM ELECTRODE OF A CAPACITOR IN A MEMORY DEVICE

(75) Inventor: Shih-Chi Shu, Chung-Li (TW)

(73) Assignee: Nanya Technology Corporation, Taoyuan (TW)

(*) Notice: Subject to any disclaimer, the term of this patent is extended or adjusted under 35 U.S.C. 154(b) by 5 days.

(21) Appl. No.: 10/283,977

(22) Filed: Oct. 30, 2002

(65) Prior Publication Data
US 2003/0181016 A1 Sep. 25, 2003

(30) Foreign Application Priority Data
Mar. 22, 2002 (TW) ........................... 91105525 A (51) Int. Cl.⁷ ............................................. H01L 21/20
(52) U.S. Cl. ..................... 438/386; 438/392; 438/243; 438/249
(58) Field of Search .................. 438/386, 389, 438/390, 392, 243, 246, 247, 249

(56) References Cited

U.S. PATENT DOCUMENTS 5,306,390 A * 4/1994 Peek ..................... 156/659.1
5,618,751 A * 4/1997 Golden et al. .............. 438/392
6,096,598 A * 8/2000 Furukawa et al. .......... 438/392
6,541,347 B2 * 4/2003 Tsai et al. ................... 438/386

* cited by examiner

Primary Examiner—Michael Trinh

(57) ABSTRACT

A method of forming a bottom electrode of a capacitor in a memory device. A plurality of deep trenches is formed, in which the number of first deep trenches within an active area is higher than that of the second deep trenches within a peripheral area. After a doped oxide layer is formed, a photoresist layer is formed on the doped oxide layer to fill the deep trenches. Then, exposure is employed on the photoresist layer with a predetermined incident angle of light source, wherein the photoresist layer outside the level of the deep trenches is exposed, and the photoresist layer inside the deep trenches is not. Thus, the photoresist layer exposed and outside the level of the deep trenches is removed, and the photoresist layer that is not exposed and inside the deep trenches is retained. Next, a part of the photoresist layer inside the deep trenches is removed, as is the doped oxide layer outside the level of the photoresist layer. After completely removing the photoresist layer, the dopants of the doped oxide layer are driven into the exposed semiconductor substrate to form a bottom electrode surrounding the doped oxide layer.

8 Claims, 8 Drawing Sheets

METHOD OF FORMING A BOTTOM ELECTRODE OF A CAPACITOR IN A MEMORY DEVICE

BACKGROUND OF THE INVENTION

1. Field of the Invention

The present invention relates to a capacitor of a memory device and, more particularly, to a method of forming a bottom electrode of a capacitor in a memory device.

2. Description of the Related Art

Recently, semiconductor materials have been popularly employed to form memory devices and logic devices to provide various electronic consumer products, such as televisions, refrigerators, personal computers, video games, digital cameras, cellular phones, portable computers, image-sound facilities, and personal digital assistants (PDAs). A Metal-Oxide-Semiconductor (MOS) transistor, the most important device in numerous semiconductor products, basically comprises a gate electrode, a drain region and a source region, in which a channel effect between the source region and drain region is formed at different gate voltages to determine the on/off states of the MOS transistor. Thus, the MOS transistor, serving as a digital and solid-state switch, is integrated into IC devices with other functional devices. A typical dynamic random access memory (DRAM) device has a memory cell array and peripheral circuits, such as sensing amplifiers. Each memory cell comprises a MOS field effect transistor and a capacitor formed on a silicon semiconductor substrate, in which the source region of the transistor is electrically connected to the charge-storage electrode of the capacitor. There is much interest in reducing the size of the DRAM device in order to increase its density on an integrated circuit (IC) chip, and thereby reduce size of the transistor or the capacitor. For the capacitor process, since stacked-type capacitors occupy a larger area and encounter increased capacitance with the increased height, as limited by semiconductor processes, a deep trench capacitor has been developed to provide higher capacitance within a lower profile. This is made possible by the more easily controlled depth of the deep trench in the substrate. However, as the depth of the deep trench increases, the difficulty in forming the bottom electrode of the capacitor is likewise increased.

Figure 1A:
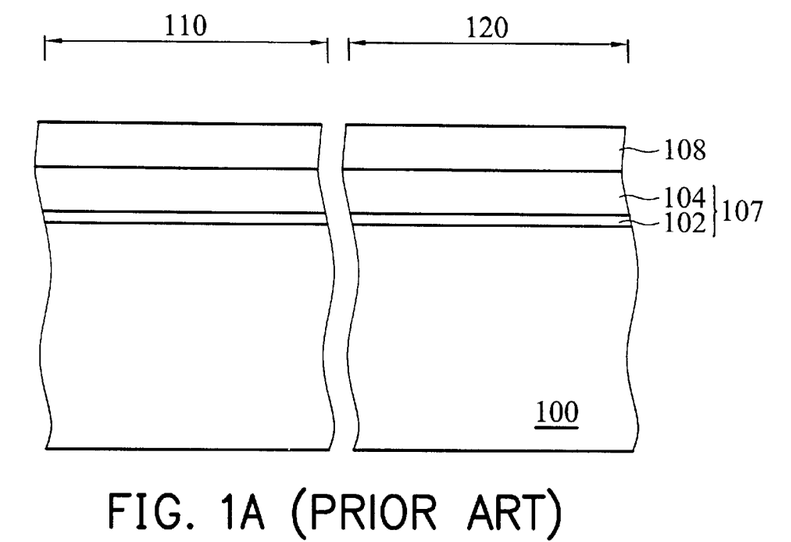
FIGS. 1A to 1G are sectional diagrams showing a deep trench capacitor process according to the prior art.

FIGS. 1A to 1G are sectional diagrams showing a conventional deep trench capacitor process. As shown in FIG. 1A, an active area 110 and a peripheral area 120 are defined on a semiconductor substrate 100, and then an oxide layer 102 and a silicon nitride layer 104 are successively deposited on the semiconductor substrate 100 to serve as a pad layer 107. Preferably, the oxide layer 102 of 50~100 Å thickness is formed by oxidation, and the silicon nitride layer 104 of 1600~3000 Å thickness is formed by chemical vapor deposition (CVD). Next, using the CVD method, a shielding layer 108 of boron-doped boron silicon glass (BSG) and 5000~20000 Å thickness is deposited on the pad layer 107.

Figure 1B:
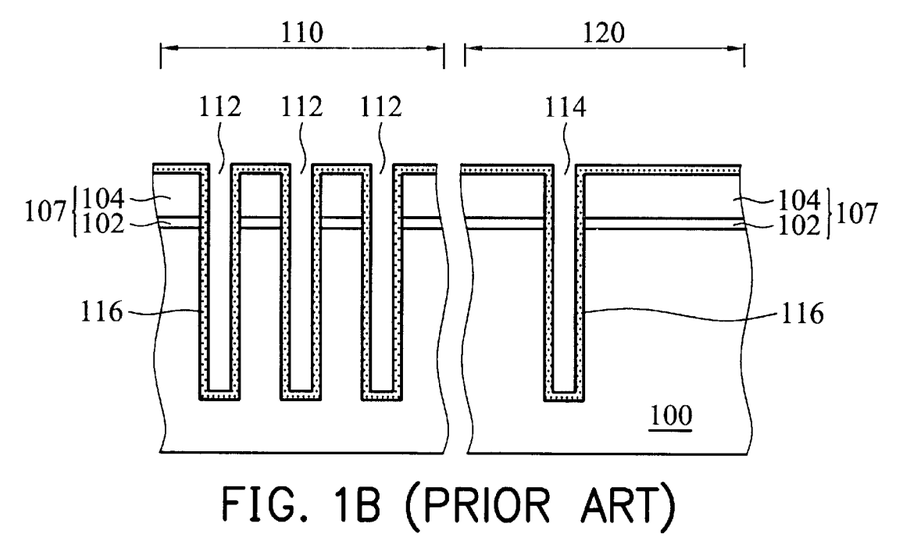

As shown in FIG. 1B, using photolithography and etching to move parts of the shielding layer 108, the pad layer 107 and the semiconductor substrate 100, a plurality of first deep trenches 112 is formed within the active area 110, and a plurality of second deep trenches 114 is formed within the peripheral area 120. Preferably, the number of the second deep trench 114 is lower than that of the first deep trench 112, that is, the arranged density of the second deep trenches 114 within the peripheral area 120 is lower than that of the first deep trenches 112 within the active area 110. Then, the shielding layer 108 is etched to expose the pad layer 107. Next, using low pressure chemical vapor deposition (LPCVD) with a diffusion process, an ion implantation, or an in-situ implantation, a arsenic-doped oxide layer 116 of approximately 300 Å thickness is formed on the exposed surface of the pad layer 107 and the sidewall/bottom of the first/second deep trenches 112 and 114.

Figure 1C:
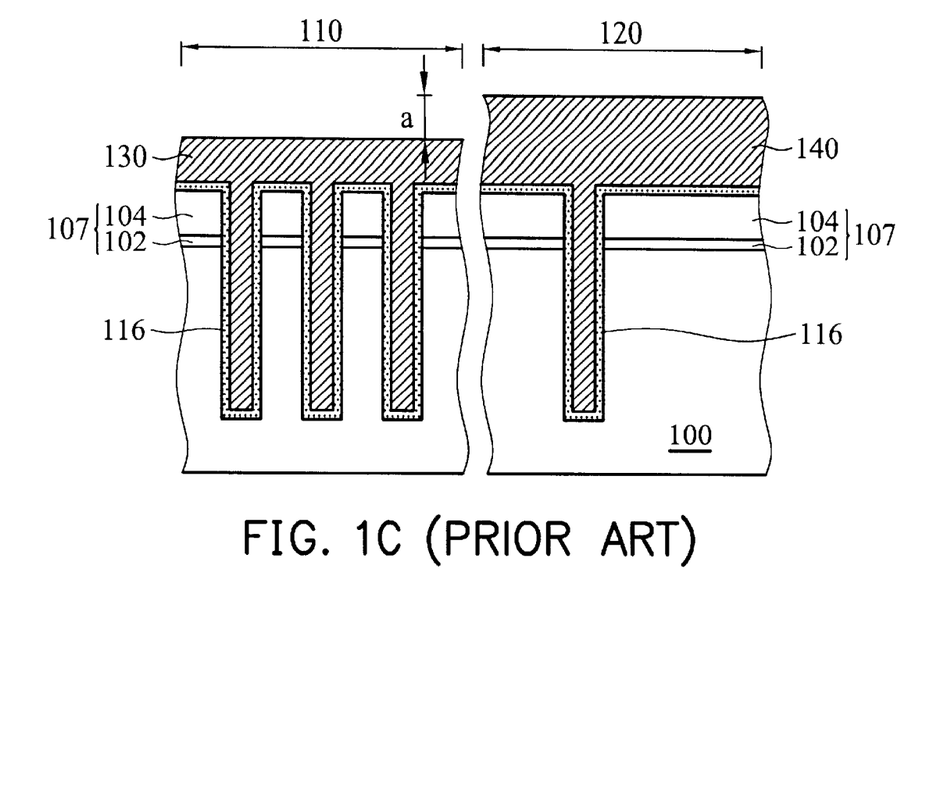

As shown in FIG. 1C, a photoresist layer is coated on the doped oxide layer 116 to fill the deep trenches 112 and 114, in which a photoresist layer 130 fills the first deep trenches 112 and a photoresist layer 140 fills the second deep trenches 114. Since the arranged density of the second deep trenches 114 within the peripheral area 120 is lower than that of the first deep trenches 112 within the active area 110, the photoresist layer 140 within the peripheral area 120 is thicker than the photoresist layer 130 within the active area 110. The difference in thickness between the photoresist layer 130 and the photoresist layer 140, indicated by the symbol "a", is approximately 3000Å.

Figure 1D:
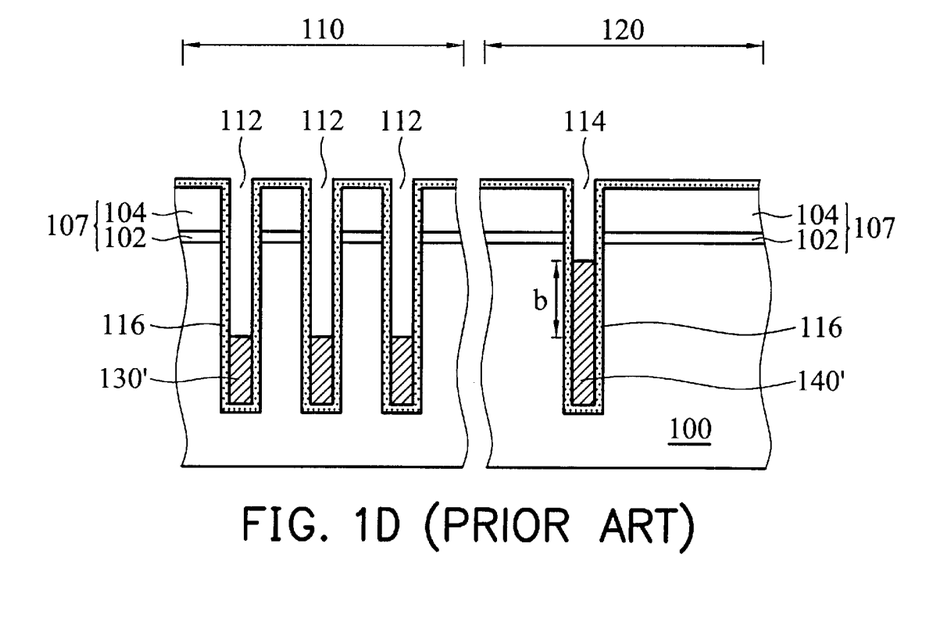

As shown in FIG. 1D, using etching to remove a part of the photoresist layer, the photoresist layer remaining in the first deep trench 112 is indicated as a photoresist layer 130', and the photoresist layer remaining in the second deep trench 114 is indicated as a photoresist layer 140'. Since the photoresist layer 140 within the peripheral area 120 is thicker than the photoresist layer 130 within the active area 110, the photoresist layer 140' is thicker than the photoresist layer 130'. The difference in thickness between the photoresist layer 130' and the photoresist layer 140', that is the step height, indicated by the symbol "b", is approximately 6000Å.

Figure 1E:
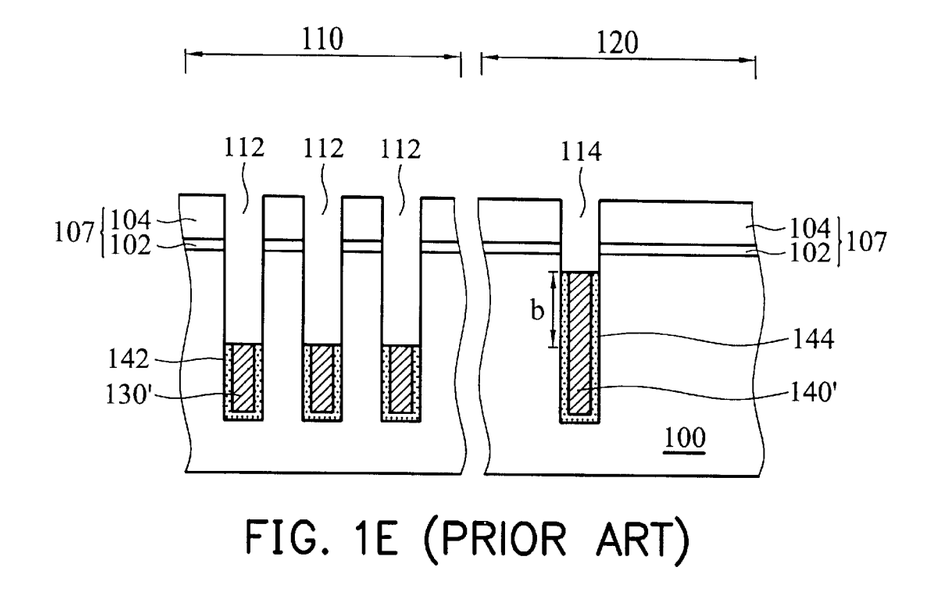

As shown in FIG. 1E, continuously using isotropic etching to remove the exposed portion of the doped oxide layer 116 higher than the photoresist layers 130' and 140', a part of the semiconductor substrate 100 on the sidewall of the first/second deep trenches 112 and 114 is exposed. Hereinafter, the remaining portions of doped oxide layer 116 within the first deep trench 112 and the second deep trench 114 are indicated as a doped oxide layer 142 and a doped oxide layer 144, respectively. The difference in thickness between the doped oxide layer 142 and the doped oxide layer 144, that is the step height, indicated by the symbol "b", is approximately 6000Å.

Figure 1F:
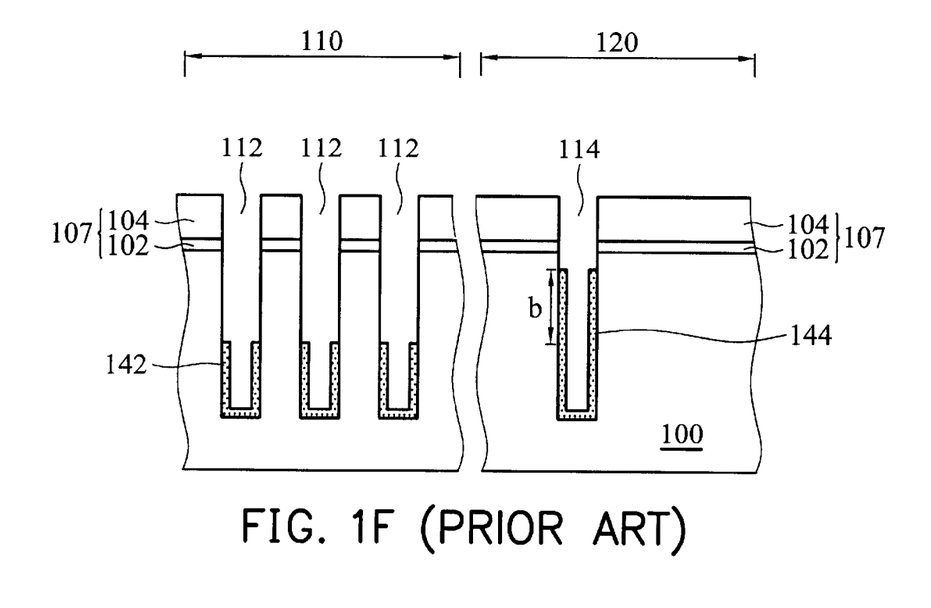

As shown in FIG. 1F, the photoresist layer 130' within the first deep trenches 112 and the photoresist layer 140' within the second deep trenches 114 are completely removed.

Figure 1G:
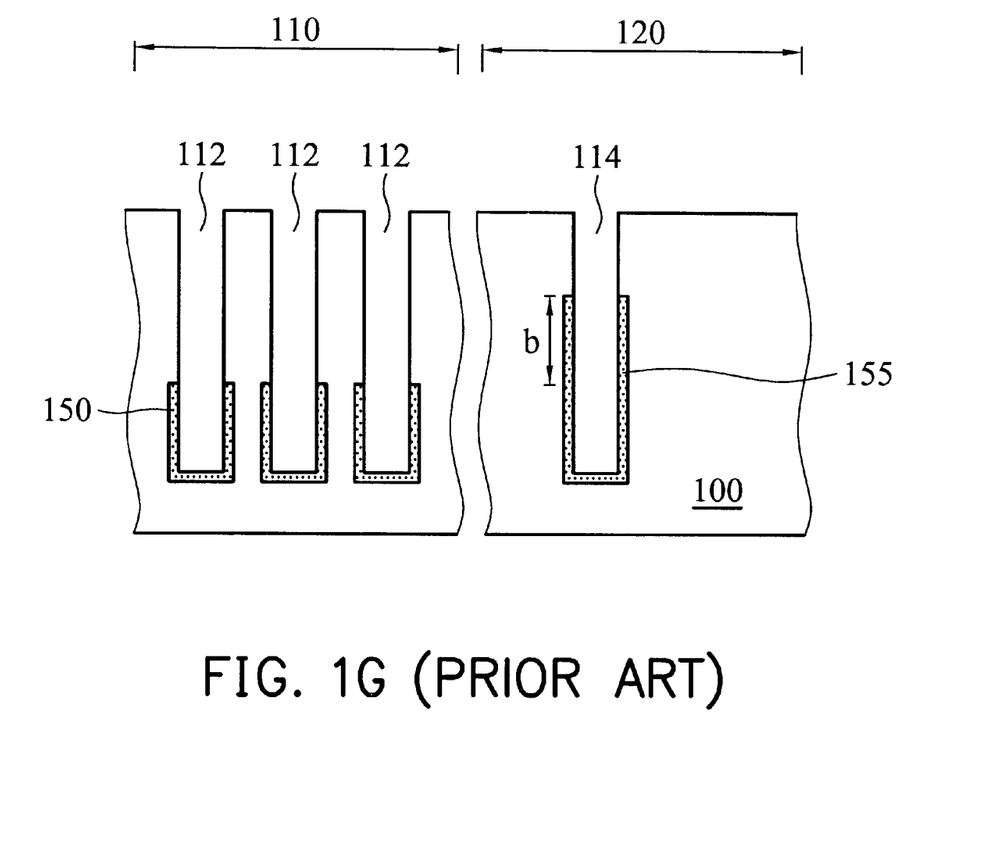

As shown in FIG. 1G, an oxide layer (not shown) is formed by LPCVD to cover the entire exposed surface of the semiconductor substrate 100, and then the dopants in the doped oxide layers 142 and 144 are driven into the semiconductor substrate 100 by a drive-in process. Thus, the diffusion regions 150 and 155 surrounding the doped oxide layers 142 and 144, respectively, serve as bottom electrodes of the capacitor. Finally, the oxide layer, the doped oxide layers 142 and 144, and the pad layer 107 are removed to complete the bottom electrode process.

However, since the different arranged densities of deep trenches in the active area 110 and the peripheral area 120 cause differences in the step height between doped oxide layer 142 within the active area 110 and the doped oxide layer 144 within the peripheral area 120, the bottom electrode 150 within the active area 110 and the bottom electrode 155 within the peripheral area 120, different capacitances occur in the active area 110 and the peripheral area 120. This may affect the original setting functions to inhibit the functionality of the memory device incapable of normal work.

SUMMARY OF THE INVENTION

The present invention provides a method of forming a bottom electrode of a deep trench capacitor in a DRAM process, which controls the incident angle of the light source on the photoresist layer during the exposure process to equalize the heights of the bottom electrodes within the active area and the peripheral area.

In the method of forming a bottom electrode of a capacitor in a memory device, an active area and a peripheral area are defined on a semiconductor substrate, and then a pad layer and a shielding layer are successively formed on the semiconductor substrate. Next, parts of the shielding layer, the pad layer and the semiconductor substrate are removed to form a plurality of first deep trenches within the active area and a plurality of second deep trenches within the peripheral area, wherein the number of the first deep trenches is higher than the number of the second deep trenches. Next, a doped oxide layer is formed on the entire surface of the semiconductor substrate to cover the surfaces of the pad layer, the sidewall and bottom of the first deep trenches and the second deep trenches. Thereafter, a photoresist layer is formed on the doped oxide layer to fill the first deep trenches and the second deep trenches. Then, exposure is employed on the photoresist layer with a predetermined incident angle of light source, wherein the photoresist layer outside the level of the deep trenches is exposed, but the photoresist layer inside the deep trenches is not. Thus, the photoresist layer exposed and outside the level of the deep trenches is removed, and the photoresist layer that is not exposed and inside the deep trenches is retained. Next, a part of the photoresist layer inside the first deep trenches and the second deep trenches is removed. Next, the doped oxide layer outside the level of the photoresist layer is removed to expose the semiconductor substrate on parts of the sidewalls of the first deep trenches and the second deep trenches. Thereafter, the photoresist layer remaining in the first deep trenches and the second deep trenches is removed. Then, an oxide layer is formed on the entire surface of the semiconductor substrate. Next, a drive-in process diffuses the dopants of the doped oxide layer into the exposed semiconductor substrate to form a bottom electrode surrounding the doped oxide layer. Finally, the oxide layer, the doped oxide layer and the pad layer are removed.

Accordingly, it is a principal object of the invention to equalize the heights of the bottom electrodes of the deep trench capacitor within the active area and within the peripheral area.

It is another object of the invention to equalize the capacitance of the deep trench capacitors within the active area and within the peripheral area.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

FIGS. 2A to 2G are sectional diagrams showing a deep trench capacitor process according to the present invention.

Figure 2A:
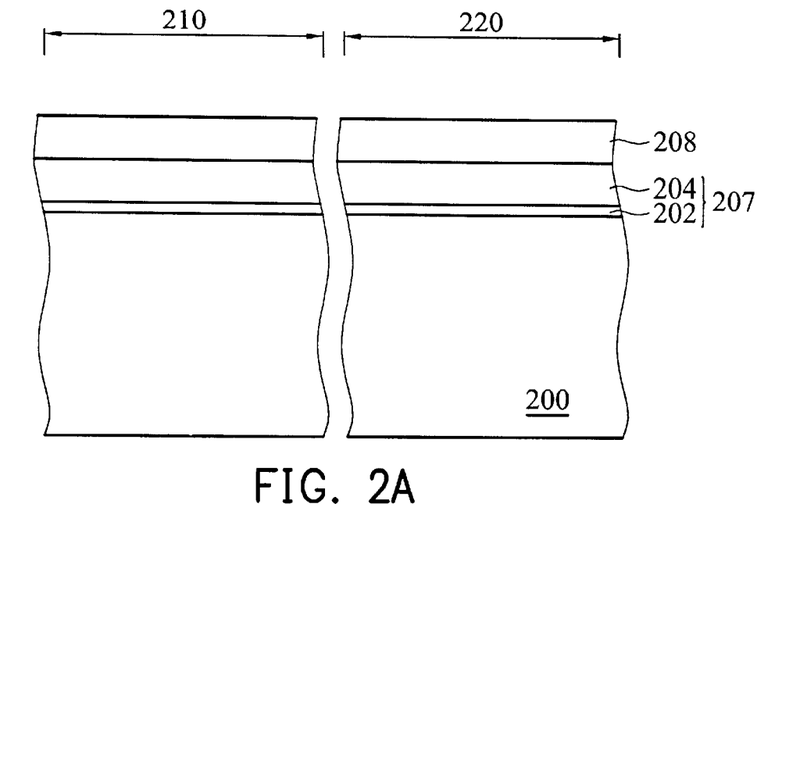
FIGS. 2A to 2G are sectional diagrams showing a deep trench capacitor process according to the present invention.

As shown in FIG. 2A, a semiconductor substrate 200 is formed with a Si or Ge semiconductor material by an epitaxial growth method or a silicon-on-insulator (SOI) method. A case using a p-type semiconductor substrate is described hereinafter.

First, an active area 210 and a peripheral area 220 are defined on a semiconductor substrate 200, and then an oxide layer 202 and a silicon nitride layer 204 are successively deposited on the semiconductor substrate 100 to serve as a pad layer 207. Preferably, the oxide layer 202 of 100~600 Å thickness is formed by oxidation, and the silicon nitride layer 204 of 1600~3000 Å thickness is formed by chemical vapor deposition (CVD). Next, a shielding layer 208 of 5000~20000 Å thickness is deposited on the pad layer 207. The formation of the shielding layer 208 may be CVD, APCVD, SAPCVD, LPCVD, PECVD or HDPCVD with an in-situ boron-ion implantation to form a boron-doped boron silicon glass (BSG) layer.

Figure 2B:
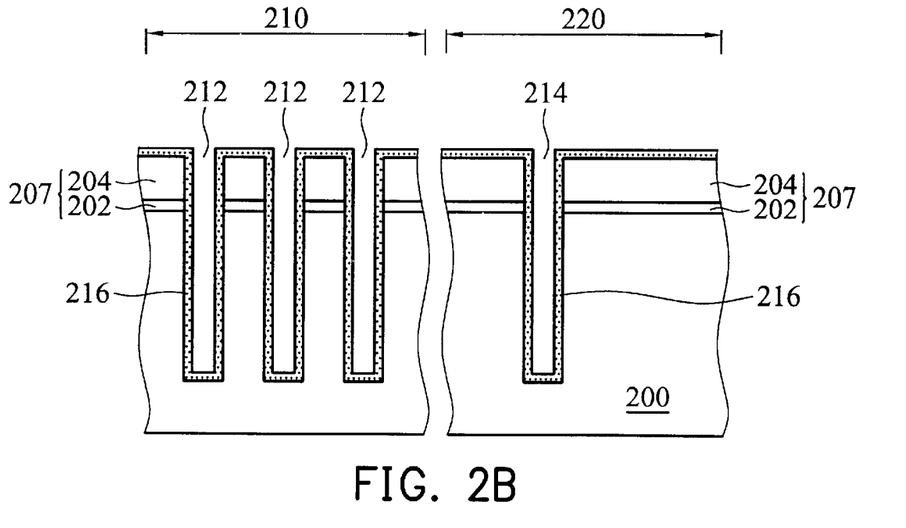

As shown in FIG. 2B, using photolithography and etching to move parts of the shielding layer 208, the pad layer 207 and the semiconductor substrate 200, a plurality of first deep trenches 212 is formed within the active area 210, and a plurality of second deep trenches 214 is formed within the peripheral area 220. Preferably, the number of the second deep trenches 214 is lower than that of the first deep trench 212, that is, the arranged density of the second deep trenches 214 within the peripheral area 220 is lower than that of the first deep trenches 212 within the active area 210. Then, the shielding layer 208 is etched to expose the pad layer 207. Next, using CVD, APCVD, SAPCVD, LPCVD, PECVD or HDPCVD with a diffusion process, an ion implantation, or an in-situ implantation, a doped oxide layer 216 of arsenic-doped arsenic silicon glass and approximately 100~500 Å thickness is conformally formed on the exposed surface of the pad layer 207 and the sidewall/bottom of the first/second deep trenches 212 and 214.

Figure 2C:
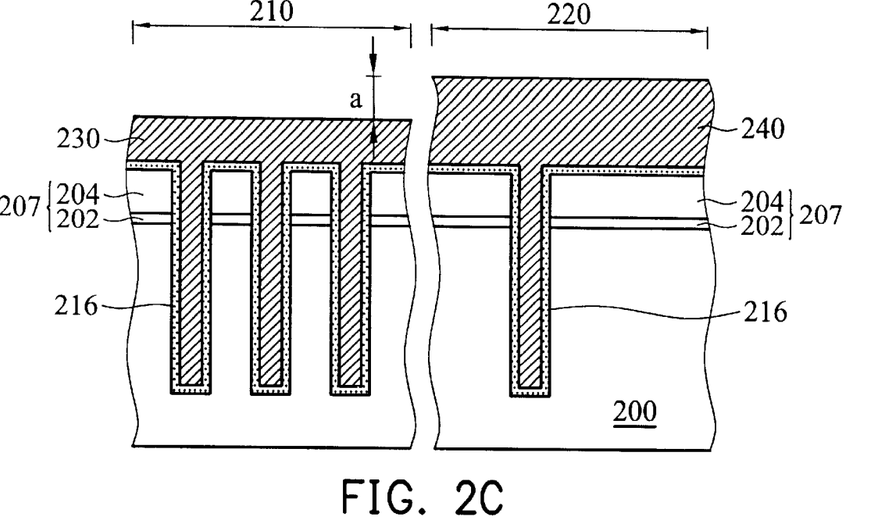

As shown in FIG. 2C, a photoresist layer is coated on the doped oxide layer 216 to fill the deep trenches 212 and 214, in which a photoresist layer 230 fills the first deep trenches 212 and a photoresist layer 240 fills the second deep trenches 214. Since the arranged density of the second deep trenches 2214 within the peripheral area 220 is lower than that of the first deep trenches 212 within the active area 210, the photoresist layer 240 within the peripheral area 220 is thicker than the photoresist layer 230 within the active area 210. The difference in thickness between the photoresist layer 230 and the photoresist layer 240, indicated by the symbol "a", is approximately 2000~4500Å.

Figure 2D:
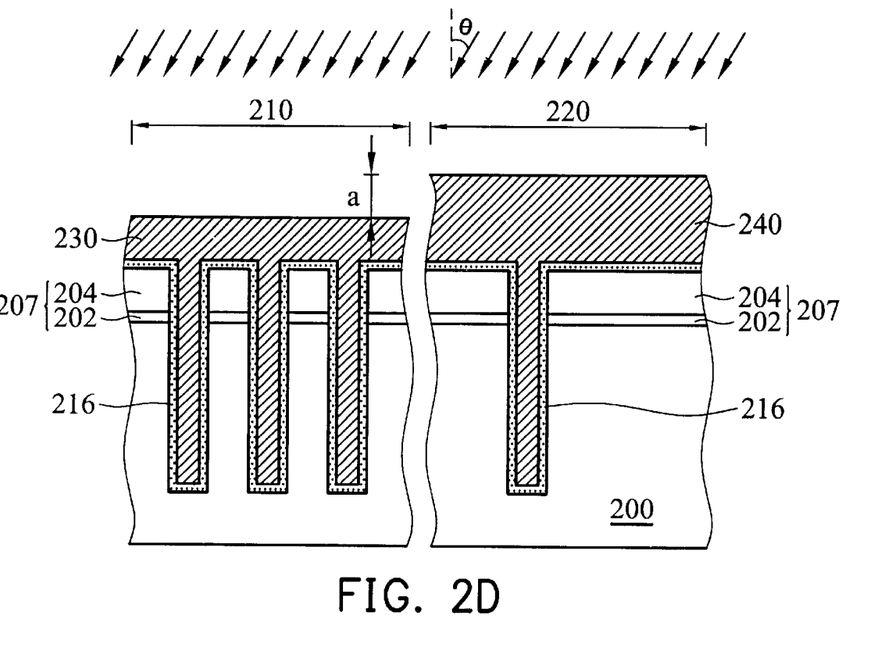

As shown in FIG. 2D, exposure is employed on the photoresist layers 230 and 240 outside the deep trenches 212 and 214, in which an included angle θ between the radiating direction and the normal direction is approximately 25°~90° in order to prevent undesirable influence on the photoresist layers 230 and 240 inside the deep trenches 212 and 214 from the exposure process. Also, the type of light source and the exposure time is changed depending on the material characteristics of the photoresist layers 230 and 240.

Figure 2E:
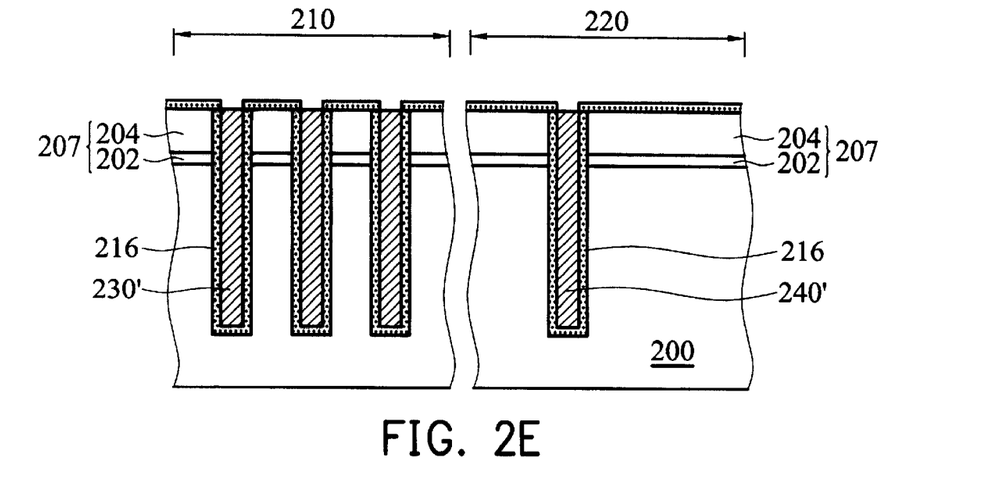

As shown in FIG. 2E, using developing, the photoresist layers 230 and 240 above the level of the deep trenches 212 and 214 are removed, thus the remaining photoresist layer 230 within the first deep trench 212 is indicated as 230', and the remaining photoresist layer 240 within the second deep trench 214 is indicated as 240. Since the photoresist layers 230 and 240 above the level of the deep trenches 212 and 214 have been exposed, they are easily dissolved by developer until completely removed. Comparatively, the photoresist layers 230' and 240' within the deep trenches 212 and 214 are kept from exposure by controlling the incident angle of the light source, they fully remain in the deep trenches 212 and 214.

Figure 2F:
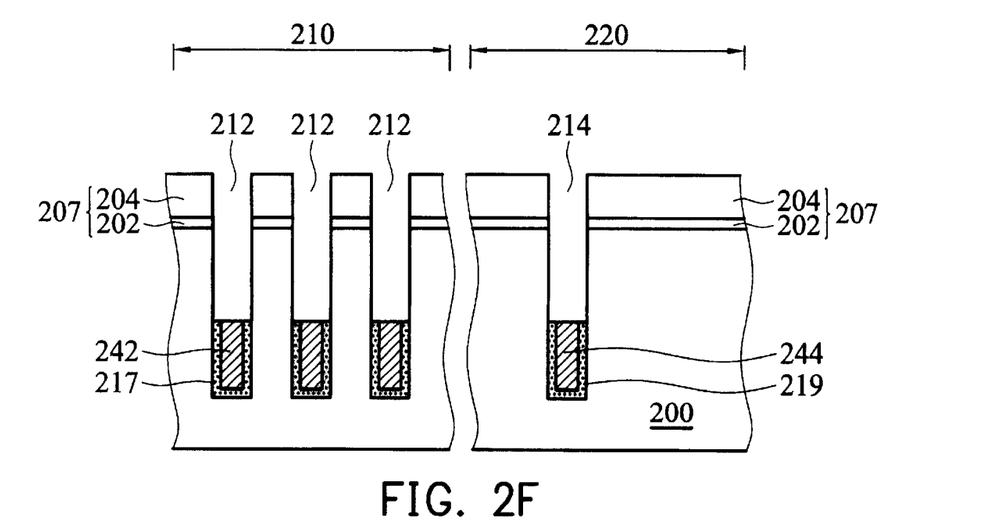

As shown in FIG. 2F, parts of the photoresist layers 230' and 240' are removed to become the photoresist layers 242 and 244 within the first/second deep trenches 212 and 214 with the same altitude. Then, the doped oxide layer 216 on the pad layer 207 is removed, and the doped oxide layer 216 on the sidewall of the deep trenches 212 and 214 is partially removed to become the doped oxide layers 217 and 219 within the first deep trench 212 and the second deep trench 214, respectively. Thus, the top of the doped oxide layers 217 and 219 is leveled with the top of the photoresist layers 242 and 244, and the semiconductor substrate 200 on parts of the sidewalls of the deep trenches 212 and 214 is exposed.

Figure 2G:
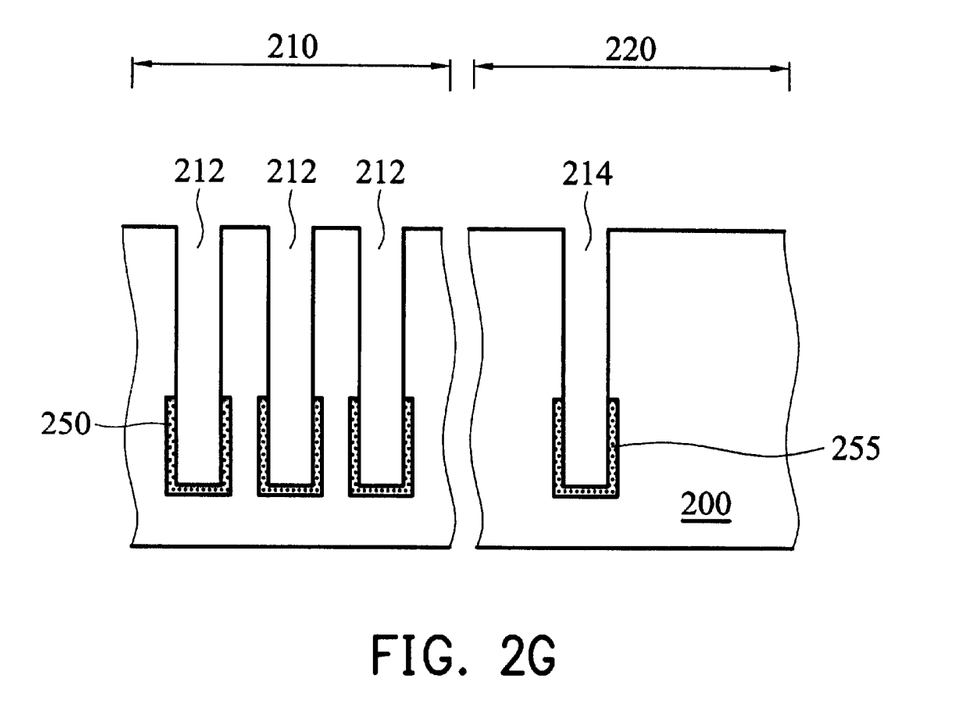

As shown in FIG. 2G, after removing the photoresist layers 242 and 244, an oxide layer (not shown) of 200~800 Å is formed by LPCVD to cover the entire exposed surface of the semiconductor substrate 100, and then the dopants in the doped oxide layers 217 and 219 are driven into the semiconductor substrate 200 by a drive-in process. Thus, the diffusion regions 250 and 255 surrounding the doped oxide layers 217 and 219, respectively, serve as bottom electrodes of the capacitor. Finally, the oxide layer, the doped oxide layers 217 and 219, and the pad layer 207 are removed to complete the bottom electrode process It is to be understood that the present invention is not limited to the embodiments described above, but encompasses any and all embodiments within the scope of the following claims.

What is claimed is:

1. A method of forming a bottom electrode of a capacitor in a memory device, comprising:

providing a semiconductor substrate;

defining an active area and a peripheral area on the semiconductor substrate;

forming a pad layer on the semiconductor substrate;

forming a shielding layer on the pad layer;

removing parts of the shielding layer, the pad layer and the semiconductor substrate to form a plurality of first deep trenches within the active area and a plurality of second deep trenches within the peripheral area, wherein the number of the first deep trenches is higher than the number of the second deep trenches;

forming a doped oxide layer on the entire surface of the semiconductor substrate to cover the surfaces of the pad layer, the sidewall and bottom of the first deep trenches and the second deep trenches;

forming a photoresist layer on the doped oxide layer to fill the first deep trenches and the second deep trenches;

performing an exposure process on the photoresist layer with a predetermined incident angle of light source, wherein the photoresist layer outside the level of the deep trenches is exposed, and the photoresist layer inside the deep trenches is not exposed;

removing the photoresist layer exposed and outside the level of the deep trenches, wherein the photoresist layer that is not exposed and inside the deep trenches is retained;

removing a part of the photoresist layer inside the first deep trenches and the second deep trenches;

removing the doped oxide layer outside the level of the photoresist layer to expose the semiconductor substrate on parts of the sidewalls of the first deep trenches and the second deep trenches;

removing the photoresist layer remaining in the first deep trenches and the second deep trenches;

performing a drive-in process to diffuse the dopants of the doped oxide layer into the exposed semiconductor substrate to form a bottom electrode surrounding the doped oxide layer; and removing the doped oxide layer and the pad layer.

2. The method of forming a bottom electrode of a capacitor in a memory device according to claim 1, wherein the semiconductor substrate is a silicon substrate.

3. The method of forming a bottom electrode of a capacitor in a memory device according to claim 1, wherein the pad layer comprises an oxide layer and a silicon nitride layer.

4. The method of forming a bottom electrode of a capacitor in a memory device according to claim 1, wherein the shielding layer is boron silicon glass (BSG).

5. The method of forming a bottom electrode of a capacitor in a memory device according to claim 1, wherein the shielding layer is 5000~20000Å.

6. The method of forming a bottom electrode of a capacitor in a memory device according to claim 1, wherein during the exposure process, an included angle (between the radiating direction and the normal direction is 25°~90°.

7. The method of forming a bottom electrode of a capacitor in a memory device according to claim 1, wherein the doped oxide layer is arsenic-doped arsenic silicon glass.

8. The method of forming a bottom electrode of a capacitor in a memory device according to claim 1, wherein the doped oxide layer is 100~1000 Å.

* * * * *